US006901148B2

(12) United States Patent
Yoshino et al.

(10) Patent No.: US 6,901,148 B2
(45) Date of Patent: May 31, 2005

(54) AUTOMATIC SOUND FIELD CORRECTING DEVICE

(75) Inventors: Hajime Yoshino, Tokorozawa (JP); Kazuya Tsukada, Tokorozawa (JP)

(73) Assignee: Pioneer Corporation, Tokyo-to (JP)

( * ) Notice: Subject to any disclaimer, the term of this patent is extended or adjusted under 35 U.S.C. 154(b) by 594 days.

(21) Appl. No.: 10/119,849

(22) Filed: Apr. 11, 2002

(65) Prior Publication Data

US 2002/0159605 A1 Oct. 31, 2002

(30) Foreign Application Priority Data

Apr. 27, 2001 (JP) ........................................ 2001-133571

(51) Int. Cl.[7] .............................. H03G 5/00; H03G 3/00
(52) U.S. Cl. .......................................... 381/103; 381/61
(58) Field of Search .............................. 381/61, 66, 96, 381/97, 98, 101, 102, 103, 108, 111, 122, 94.1, 94.3, 59; 333/28 R

(56) References Cited

U.S. PATENT DOCUMENTS 4,118,601 A * 10/1978 Yeap .......................... 381/103
4,559,569 A * 12/1985 Otsuki et al. .................. 360/65
4,688,258 A * 8/1987 Kunugi et al. .............. 381/103
4,694,498 A * 9/1987 Suzuki et al. ............... 381/103
4,955,058 A * 9/1990 Rimkeit et al. ............. 381/103
6,072,879 A * 6/2000 Ouchi et al. ................... 381/61
6,655,212 B2 * 12/2003 Ohta ............................ 73/586
2001/0016046 A1 * 8/2001 Ohta ............................ 381/98

FOREIGN PATENT DOCUMENTS

JP 6-13292 2/1994

* cited by examiner

*Primary Examiner*—Xu Mei
(74) *Attorney, Agent, or Firm*—Young & Thompson

(57) ABSTRACT

In the automatic sound field correcting device, a plurality of audio signals to be reproduced by a plurality of speakers are input, and the signal processing is applied on the corresponding signal transmission paths. The measurement signal is supplied for the respective signal transmission paths, and output by the corresponding speakers. The sound of the output measurement signal is collected and the detection signal of the collected sound is generated. The equalizer gain values are determined based on the detection signals. By determining the identical equalizer gain values for the plural signal transmission paths for which the phases of the audio signals are to be matched, the phases of the signals on those signal transmission paths are matched, and the strange auditory feeling due to the phase mismatch can be reduced.

14 Claims, 14 Drawing Sheets

AUTOMATIC SOUND FIELD CORRECTING DEVICE

BACKGROUND OF THE INVENTION

1. Field of the Invention

This invention relates to an automatic sound field correcting device for automatically correcting sound field characteristics in an audio system having a plurality of speakers.

2. Description of Related Art

For an audio system having a plurality of speakers to provide a high quality sound field space, it is required to automatically create an appropriate sound field space with much presence. In other words, it is required for the audio system to automatically correct sound field characteristics because it is quite difficult for a listener to appropriately adjust the phase characteristic, the frequency characteristic, the sound pressure level and the like of sound reproduced by a plurality of speakers by manually manipulating the audio system by himself to obtain appropriate sound field space.

An audio system of this kind is disclosed in a Japanese utility model application laid-open under 6-13292. This audio system includes equalizers for receiving audio signals of multiple channels and controlling the frequency characteristics of the audio signals, and a plurality of delay circuits for delaying the audio signals that the equalizers output for the respective channels, and the signals output by the respective delay circuits are supplied to the plurality of speakers. In addition, in order to correct the sound field characteristics, the audio system further includes a pink noise generator, an impulse generator, a selector circuit, a microphone for measuring the reproduced sound reproduced by the speakers, a frequency analyzer and a delay time calculator. The pink noise generated by the pink noise generator is supplied to the equalizers via the selector circuit, and the impulse signal generated by the impulse generator is directly supplied to the speakers via the selector circuit.

When the delay characteristic of the sound field space is to be corrected, the impulse generator directly supplies the impulse signal to the speakers. The microphone collects and measures the impulse sound reproduced by the respective speakers, and the delay time calculator analyzes the measured signal to obtain the propagation delay time of the impulse sound from the position of the speakers to the listening position. Namely, the impulse signals are directly supplied to the respective speakers with delay times, and the delay time calculator obtains the time differences between the time when the respective impulse signals are supplied to the respective speakers to the time when the respective impulse signals reproduced by the respective speakers reach the microphone. Thus, the propagation delay times of the respective impulse sound are measured. Then, by adjusting the delay times of the delay circuits for the respective channels based on the propagation delay times thus measured, the delay characteristics of the sound field space are corrected.

On the other hand, when the frequency characteristics of the sound field space are to be corrected, the pink noise generator supplies the pink noise to the equalizers. Then, the microphone receives and measures the pink noise sound reproduced by the speakers, and the frequency analyzer analyses the frequency characteristics of the respective measured signals. By controlling the frequency characteristics of the equalizers by the feedback control based on the result of the analysis, the frequency characteristics of the sound field space are corrected.

However, if the frequency characteristics of the equalizers are controlled independently for the multiple channels, the phases of the signals of the multiple channels mismatch because the phases of the signals vary when different equalizer coefficients are used for different channels. Normally, when two-channel audio signals are reproduced from a pair of speakers, i.e., a right speaker and a left speaker, if the signals of two channels are in phase with each other (i.e. match), the reproduced sound image locates at a center of the left speaker and the right speaker. Therefore, the listener at the position remote from the both left and right speakers by substantially identical distance feels like the reproduced sound comes from the center of the left and right speakers. However, if the audio signals of the left and right channels are out of phase with each other (i.e., mismatch), the reproduced sound image does not correctly locate at the center of the left and right speakers, and the listener acoustically feels like the sound source is at other position. Therefore, if the audio signals from the left and right speakers are out of phase, the listener feels the reproduced sound coming from unnatural direction and may have strange auditory feeling.

Further, a high-quality type audio system has multiple pairs of left and right speakers positioned forward and backward of the listener, and multi-channel sounds from those speakers are mixed to create the sound field. If the phases of the signals from the pair of the speakers mismatch, correct phantom sound image cannot be created, and the listener feels more strange. This prevents correct sound field reproduction, and consequently damages the presence of the sound field.

SUMMARY OF THE INVENTION

It is an object of the present invention to provide an automatic sound field correcting device that can provide high quality sound field space by reducing the adverse effect resulting from the phase mismatch between signals from multiple speakers.

According to one aspect of the present invention, there is provided an automatic sound field correcting device for applying signal processing onto a plurality of audio signals on corresponding signal transmission paths and outputting processed audio signals to a plurality of speakers, including: equalizers for adjusting frequency characteristics of the audio signals on the signal transmission paths; a measurement signal supplying unit for supplying a measurement signal to the respective signal transmission paths; a sound collecting unit for collecting sound of the measurement signals output by the speakers and outputting a detection signal of the collected sound; and a gain value determining unit for determining equalizer gain values which the equalizers use for adjustment of the frequency characteristics based on the detection signal and for supplying the equalizer gain values to the equalizers, wherein the gain value determining unit determines identical equalizer gain value for the plurality of signal transmission paths for which phases of the audio signals are to be matched.

In accordance with the automatic sound field correcting device thus configured, a plurality of audio signals to be reproduced by a plurality of speakers are input, and the signal processing is applied on the corresponding signal transmission paths. The measurement signal is supplied to the respective signal transmission paths, and output by the corresponding speakers. The sound of the output measurement signal is collected and the detection signal of the collected sound is generated. The equalizer gain values are determined based on the detection signals. By determining the identical equalizer gain values for the plural signal transmission paths for which the phases of the audio signals are to be matched, the phases of the signals on those signal transmission paths are matched, and the strange auditory feeling can be reduced.

The gain value determining unit may determine the identical equalizer gain value based on the detection signals for the sound of the measurement signal simultaneously output by the speakers of the plurality of signal transmission paths for which the phases of the audio signal are to be matched. Thus, one equalizer gain value can be determined based on the sound field characteristic including the plural signal transmission paths. Therefore, the frequency characteristics can be adjusted by using the equalizer gain values corresponding to the sound field characteristics, with the phases of the audio signals being matched.

The automatic sound field correcting device may further include an inter-path level adjusting unit for adjusting levels of the audio signals of the signal transmission paths, and the inter-path level adjusting unit may correct the levels of the signal transmission paths, prior to the adjustment of the frequency characteristics by the equalizers, such that the levels of the audio signals of the signal transmission paths become equal for all frequency bands. By this, since the equalizer gain values are determined in a state that the levels of the signal transmission paths are equal, appropriate equalizer gain values may be obtained.

The automatic sound field correcting device may further include a level change unit for changing levels of the audio signals of the signal transmission paths, and the inter-path level adjusting unit may control the level change unit to correct the levels of the signal transmission paths based on the detection signals of the sound of the measurement signals simultaneously output by the plurality of speakers of the signal transmission paths for which the phases of the audio signal are to be matched. Therefore, by using the measurement signal supplying unit used in the adjustment of the frequency characteristics, the levels of the signal transmission paths can be adjusted in advance.

The inter-path level adjusting unit may adjust the levels of the signal transmission paths such that the levels of the signal transmission paths are equal to each other after the adjustment of the frequency characteristics of the signal transmission paths. By this, the levels of the audio signals supplied to the plural speakers can be equal to provide favorable sound field space. In addition, the inter-path level adjusting unit may be used to adjust the levels, in advance, for the frequency characteristics adjustment.

The plurality of signal transmission paths for which the phases of the audio signal are to be matched may include a pair of signal transmission paths corresponding to a pair of left and right speakers. In addition, the pair of left and right speakers may include at least one of front speakers, rear speakers and surround speakers. By this, the phase mismatch between the left and the right speakers may be avoided, and the strange auditory feeling may also be avoided.

The pair of left and right speakers may include speakers for which no center speaker is positioned between the left speaker and the right speaker. If there is a center speaker between the left and right speakers, the phase mismatch is relatively difficult to recognize, and hence the frequency characteristics adjustment is prioritized to create favorable sound field space.

The gain value determining unit may determine the identical equalizer gain value by averaging the equalizer gain values determined individually for each of the signal transmission paths for which the phases of the audio signals are to be matched. By this, the influence of the phase mismatch can be eliminated by the simple averaging process.

The gain value determining unit may include: a storage unit for storing the equalizer gain values determined independently for the signal transmission paths and the identical equalizer gain values determined for the plurality of signal transmission paths for which the phases of the audio signals are to be matched; and a selecting unit for selecting one of the equalizer gain values determined independently and the identical equalizer values. By this, the priority of the phase match and the frequency characteristics of the respective channels can be determined in accordance with the sound field environment factor and/or user's taste, there by to create desired sound field space.

The measurement signal supplying unit may generate the measurement signals which correspond to the signal transmission paths and which have no correlation with each other. Thus, frequency characteristics can be adjusted more accurately.

The automatic sound field correcting device may further include a plurality of delay circuits each provided in the signal transmission path for adjusting delay characteristics of the audio signals, and the measurement signal supplying unit may generate the measurement signals having no correlation by setting different delay times for the plurality of delay circuits. By this, the measurement signal having no correlation can be generated by using the delay circuit that is used for the delay Gus characteristics correction, and hence the frequency characteristics can be accurately corrected without complicated configuration.

According to another aspect of the present invention, there is provided a computer program, embodied in a form of storage medium or a data signal, for controlling a computer to function as an automatic sound field correcting device for applying signal processing onto a plurality of audio signals on corresponding signal transmission paths and outputting the processed audio signals to a plurality of speakers, the automatic sound field correcting device including: equalizers for adjusting frequency characteristics of the audio signals on the signal transmission paths; a measurement signal supplying unit for supplying a measurement signal to the respective signal transmission paths; a sound collecting unit for collecting sound of the measurement signal output by the speakers and outputting a detection signal of the collected sound; and a gain value determining unit for determining equalizer gain values which the equalizer uses for adjustment of the frequency characteristics and for supplying the equalizer gain values to the equalizers, and the gain value determining unit may determine identical equalizer gain value for a plurality of signal transmission paths for which phases of the audio signals are to be matched.

By reading and executing the program by a computer, the computer can function as the above-described automatic sound field correcting device.

The nature, utility, and further features of this invention will be more clearly apparent from the following detailed description with respect to preferred embodiment of the invention when read in conjunction with the accompanying drawings briefly described below.

DETAILED DESCRIPTION OF THE PREFERRED EMBODIMENTS

[1] System Configuration

Figure 1:
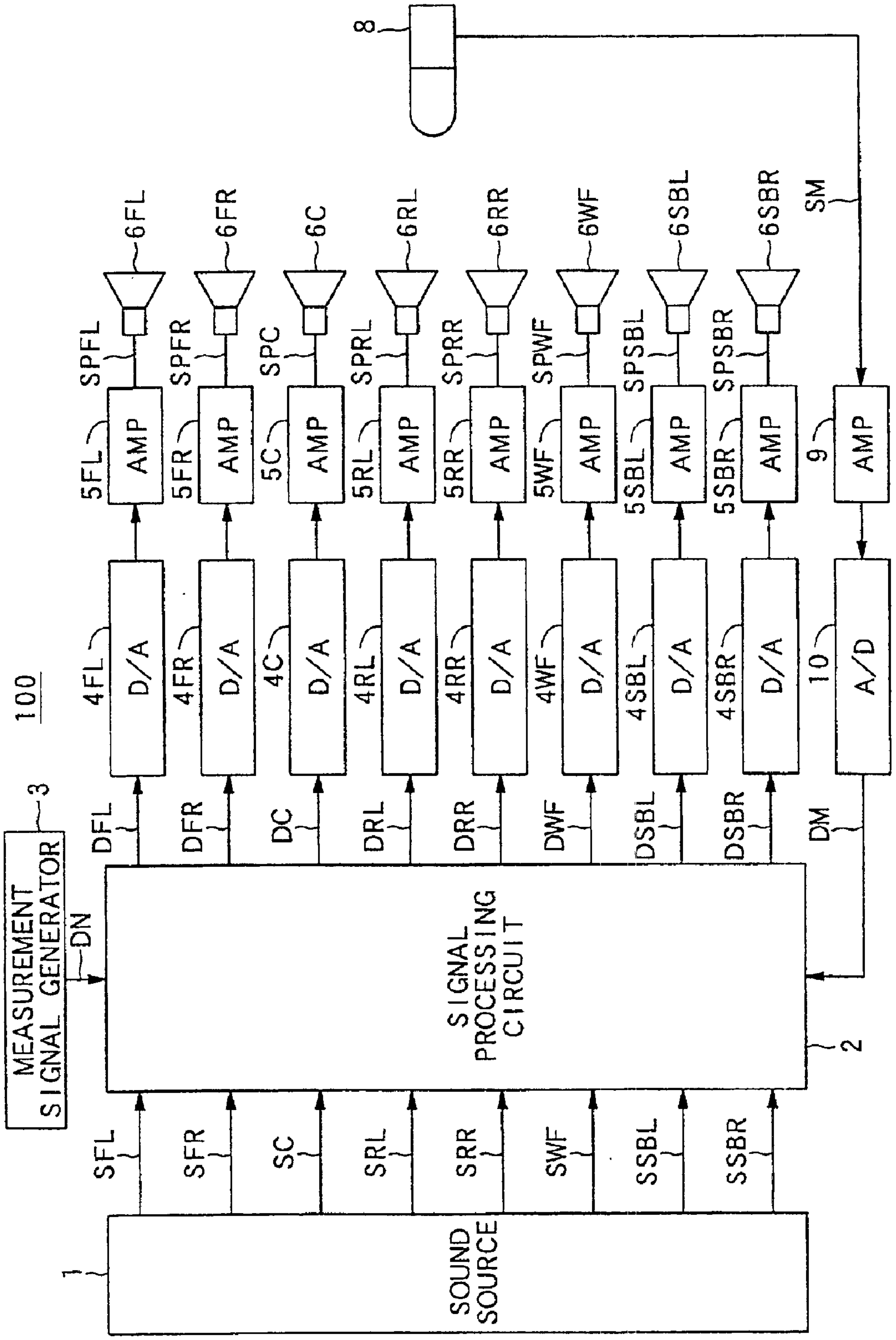
FIG. 1 is a block diagram showing a configuration of an audio system employing an automatic sound field correcting device according to an embodiment of the present invention.

A preferred embodiment of an automatic sound field correcting system according to the present invention will now be described below with reference to the attached drawings. FIG. 1 is a block diagram showing an audio system employing the automatic sound field correcting system according the embodiment of the invention.

In FIG. 1, the audio system 100 includes a sound source 1 such as a CD (Compact Disc) player or a DVD (Digital Video Disc or Digital Versatile Disc) player, a signal processing circuit 2 to which the sound source 1 supplies digital audio signals SFL, SFR, SC, SRL, SRR, SWF, SSBL and SSBR via the multi-channel signal transmission path, and a measurement signal generator 3.

While the audio system 100 includes the multi-channel signal transmission paths, the respective channels are referred to as "FL-channel", "FR-channel" and the like in the following description. In addition, the subscripts of the reference number are omitted to refer to all of the multiple channels when the signals or components are expressed. On the other hand, the subscript is put to the reference number when a particular channel or component is referred to. For example, the description "digital audio signals S" means the digital audio signals SFL to SSBR, and the description "digital audio signal SFL" means the digital audio signal of only the FL-channel.

Further, the audio system 100 includes D/A converters 4FL to 4SBR for converting the digital output signals DFL to DSBR of the respective channels processed by the signal processing by the signal processing circuit 2 into analog signals, and amplifiers 5FL to 5SBR for amplifying the respective analog audio signals output by the D/A converters 4FL to 4SBR. In this system, the analog audio signals SPFL to SPSBR after the amplification by the amplifiers 5FL to 5SBR are supplied to the multi-channel speakers 6FL to 6SBR positioned in a listening room 7, shown in FIG. 6 as an example, to output sounds.

The audio system 100 also includes a microphone 8 for collecting reproduced sounds at the listening position RV, an amplifier 9 for amplifying a collected sound signal SM output from the microphone 8, and an A/D converter 10 for converting the output of the amplifier 9 into a digital collected sound data DM to supply it to the signal processing circuit 2.

The audio system 100 activates full-band type speakers 6FL, 6FR, 6C, 6RL, 6RR having frequency characteristics capable of reproducing sound for substantially all audible frequency bands, a speaker 6WF having a frequency characteristic capable of reproducing only low-frequency sounds and surround speakers 6SBL and 6SBR positioned behind the listener, thereby creating sound field with presence around the listener at the listening position RV.

Figure 6:
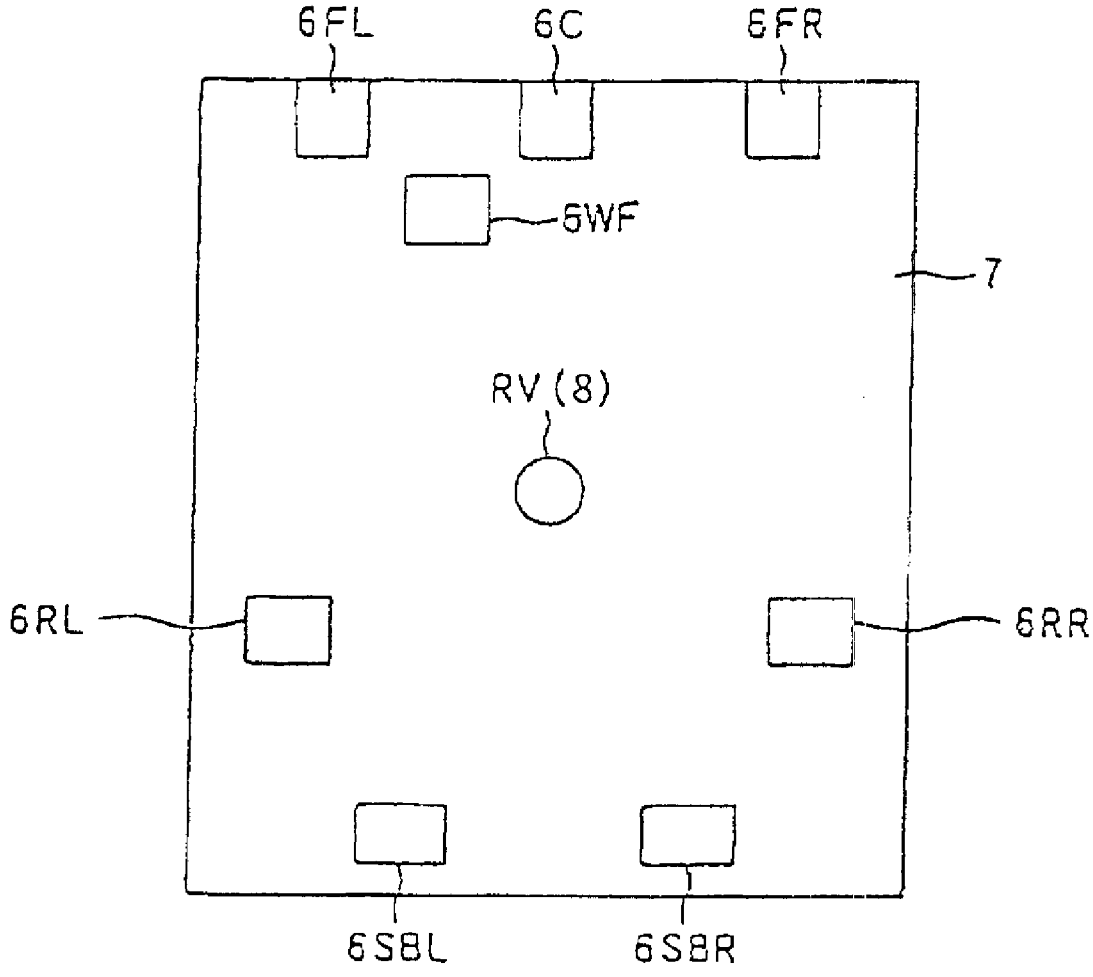
FIG. 6 is a diagram showing an example of speaker arrangement in a certain sound field environment.

With respect to the position of the speakers, as shown in FIG. 6, for example, the listener places the two-channel, left and right speakers (a front-left speaker and a front-right speaker) 6FL, 6FR and a center speaker 6C, in front of the listening position RV, according to the listener's taste. Also the listener places the two-channel, left and right speakers (a rear-left speaker and a rear-right speaker) 6RL, 6RR as well as two-channel, left and right surround speakers 6SBL, 6SBR behind the listening position RV, and further places the sub-woofer 6WF exclusively used for the reproduction of low-frequency sound at any position. The automatic sound field correcting system installed in the audio system 100 supplies the analog audio signals SPFL to SPSBR, for which the frequency characteristic, the signal level and the signal propagation delay characteristic for each channel are corrected, to those 8 speakers 6FL to 6SBR to output sounds, thereby creating sound field space with presence.

Figure 2:
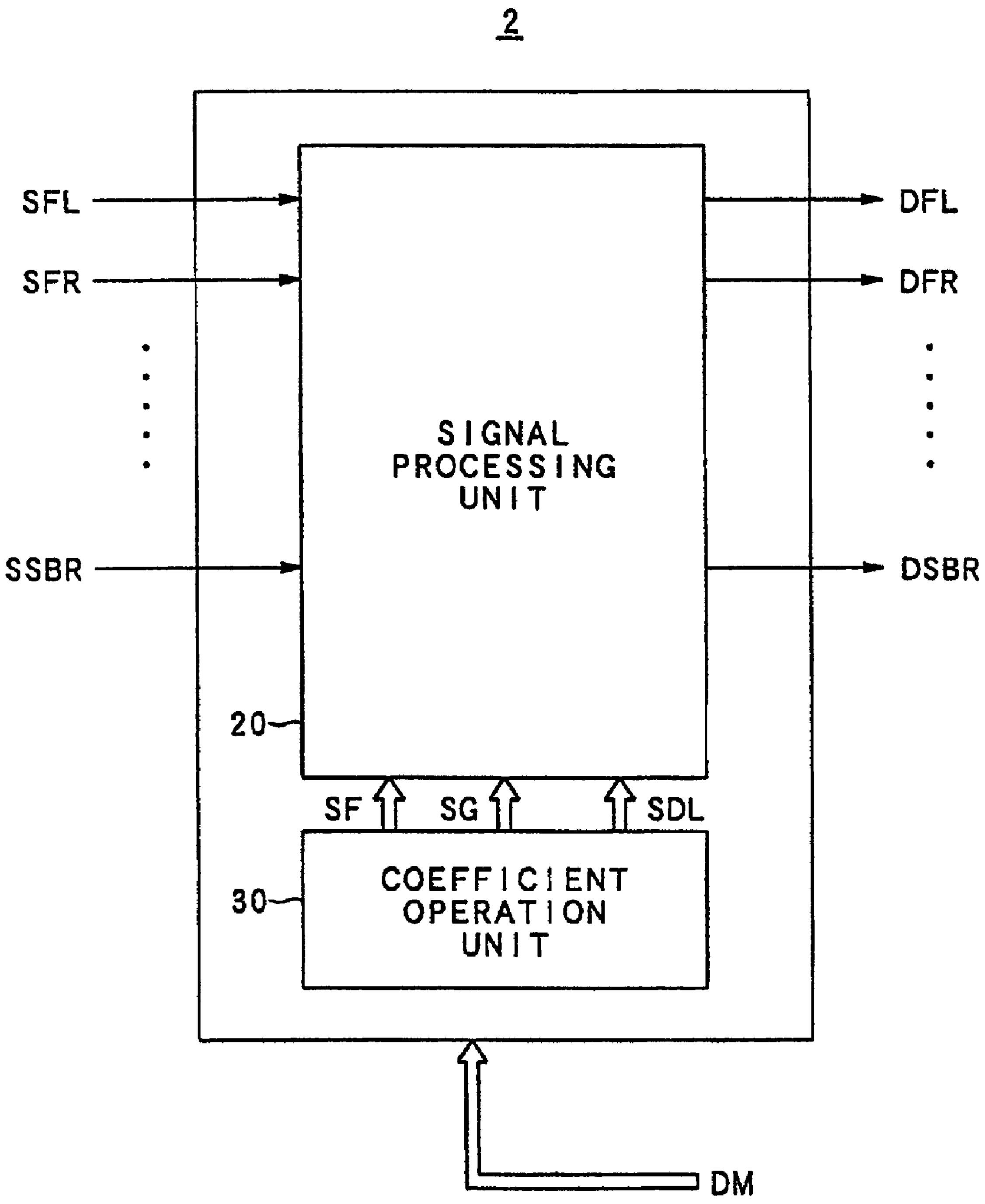
FIG. 2 is a block diagram showing an internal configuration of a signal processing circuit shown in FIG. 1.

The signal processing circuit 2 may have a digital signal processor (DSP), and roughly includes a signal processing unit 20 and a coefficient operating unit 30 as shown in FIG. 2. The signal processing unit 20 receives the multi-channel digital audio signals from the sound source 1 reproducing sound from various sound sources such as CD, DVD or else, and performs the frequency characteristic correction, the level correction and the delay characteristic correction for each channel to output the digital output signals DFL to DSBR. The coefficient operation unit 30 receives the signal collected by the microphone 8 as the a digital collected sound data DM, generates the coefficient signals SF1 to SF8, SG1 to SG8, SDL1 to SDL8 for the frequency characteristic correction, the level correction and the delay characteristic correction, and supplies them to the signal processing unit 20. The signal processing unit 20 appropriately performs the frequency characteristic correction, the level correction and the delay characteristic correction based on the collected sound data DM from the microphone 8, and the speakers 6 output optimum sounds.

Figure 3:
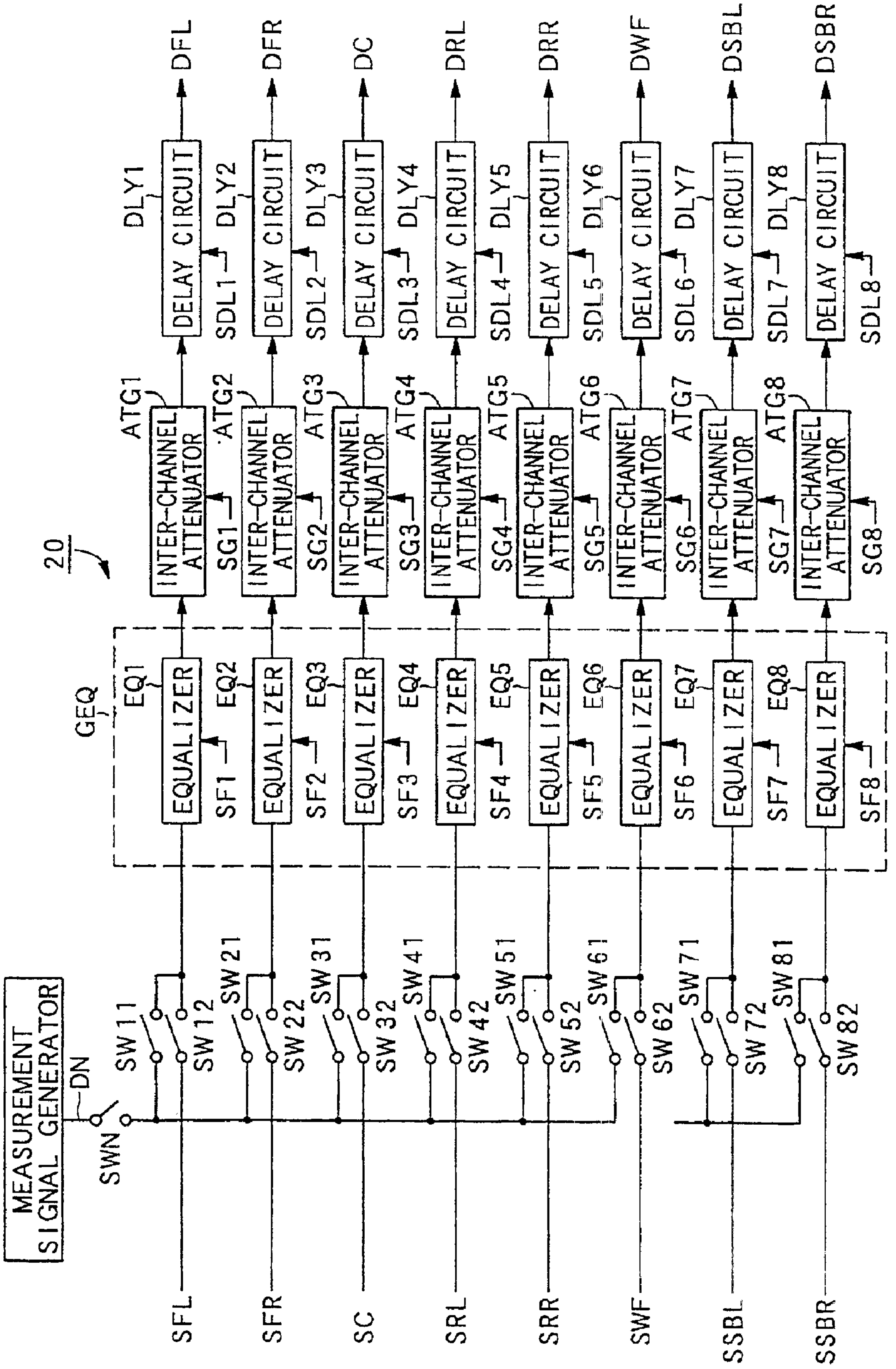
FIG. 3 is a block diagram showing a configuration of a signal processing unit shown in FIG. 2.
Figure 4:
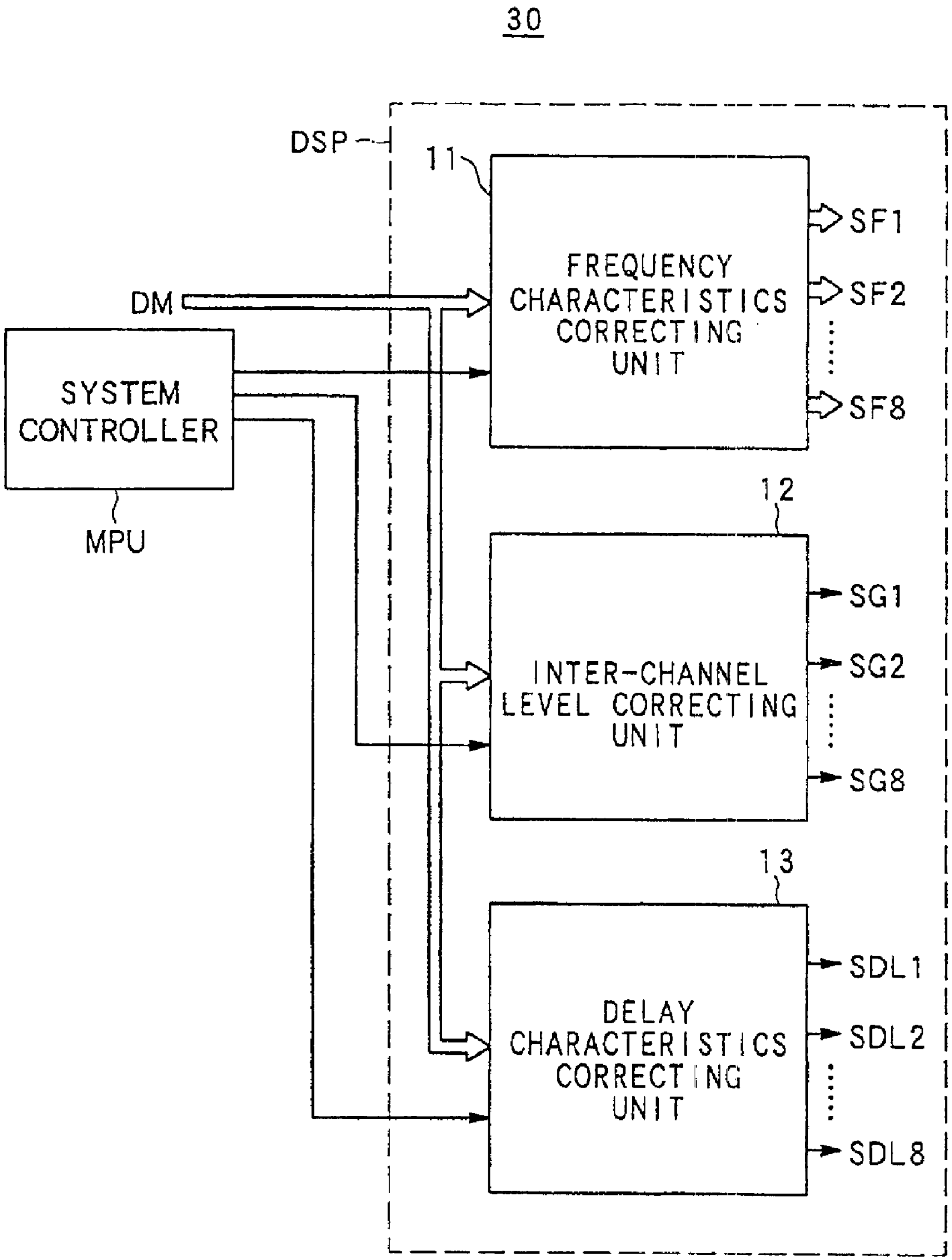
FIG. 4 is a block diagram showing a configuration of a coefficient operation unit shown in FIG. 2.

As shown in FIG. 3, the signal processing unit 20 includes a graphic equalizer GEQ, inter-channel attenuators ATG1 to ATG8, and delay circuits DLY1 to DLY8. On the other hand, the coefficient operation unit 30 includes, as shown in FIG. 4, a system controller MPU, a frequency characteristics correcting unit 11, an inter-channel level correcting unit 12 and a delay characteristics correcting unit 13. The frequency characteristics correcting unit 11, the inter-channel level correcting unit 12 and the delay characteristics correcting unit 13 constitute DSP.

The frequency characteristics correcting unit 11 controls the frequency characteristics of the equalizers EQ1 to EQ8 corresponding to the respective channels of the graphic equalizer GEQ. The inter-channel level correcting unit 12 controls the attenuation factors of the inter-channel attenuators ATG1 to ATG8, and the delay characteristics correcting unit 13 controls the delay times of the delay circuits DLY1 to DLY8. Thus, the sound field is appropriately corrected.

The equalizers EQ1 to EQ5, EQ7 and EQ8 of the respective channels are configured to perform the frequency characteristics correction for multiple frequency bands. Namely, the audio frequency band is divided into 9 frequency bands (each of the center frequencies are f1 to f9), for example, and the coefficients of the equalizer EQ are determined for each frequency bands to correct frequency characteristics. It is noted that the equalizer EQ6 is configured to control the frequency characteristic of low-frequency band.

The audio system 100 has two operation modes, i.e., an automatic sound field correcting mode and a sound source signal reproducing mode. The automatic sound field correcting mode is an adjustment mode, performed prior to the signal reproduction from the sound source 1, wherein the automatic sound field correction is performed for the environment that the audio system 100 is placed. Thereafter, the sound signal from the sound source 1 such as a CD player is reproduced in the sound source signal reproduction mode. The present invention mainly relates to the correction operation in the automatic sound field correcting mode.

With reference to FIG. 3, the switch element SW12 for switching ON and OFF the input digital audio signal SFL from the sound source 1 and the switch element SW11 for switching the input measurement signal DN from the measurement signal generator 3 are connected to the equalizer EQ1 of the FL-channel, and the switch element SW11 is connected to the measurement signal generator 3 via the switch element SWN. The switch elements SW11, SW12 and SWN are controlled by the system controller MPU configured by microprocessor and shown in FIG. 4.

When the sound source signal is reproduced, the switch element SW12 is turned ON, and the switch elements SW11 and SWN are turned OFF. On the other hand, when the sound field is corrected, the switch element SW12 is turned OFF and the switch elements SW11 and SWN are turned ON.

The inter-channel attenuator ATG1 is connected to the output terminal of the equalizer EQ1, and the delay circuit DLY1 is connected to the output terminal of the inter-channel attenuator ATG1. The output DFL of the delay circuit DLY1 is supplied to the D/A converter 4FL shown in FIG. 1.

The other channels are configured in the same manner, and switch elements SW21 to SW81 corresponding to the switch element SW11 and the switch elements SW22 to SW82 corresponding to the switch element SW12 are provided. In addition, the equalizers EQ2 to EQ8, the inter-channel attenuators ATG2 to ATG8 and the delay circuits DLY2 to DLY8 are provided, and the outputs DFR to DSBR from the delay circuits DLY2 to DLY8 are supplied to the D/A converters 4FR to 4SBR, respectively, shown in FIG. 1.

Further, the inter-channel attenuators ATG1 to ATG8 vary the attenuation factors within the range equal to or smaller than 0 dB in accordance with the adjustment signals SG1 to SG8 supplied from the inter-channel level correcting unit 12. The delay circuits DLY1 to DLY8 controls the delay times of the input signal in accordance with the adjustment signals SDL1 to SDL8 from the phase characteristics correcting unit 13.

Figure 5A:
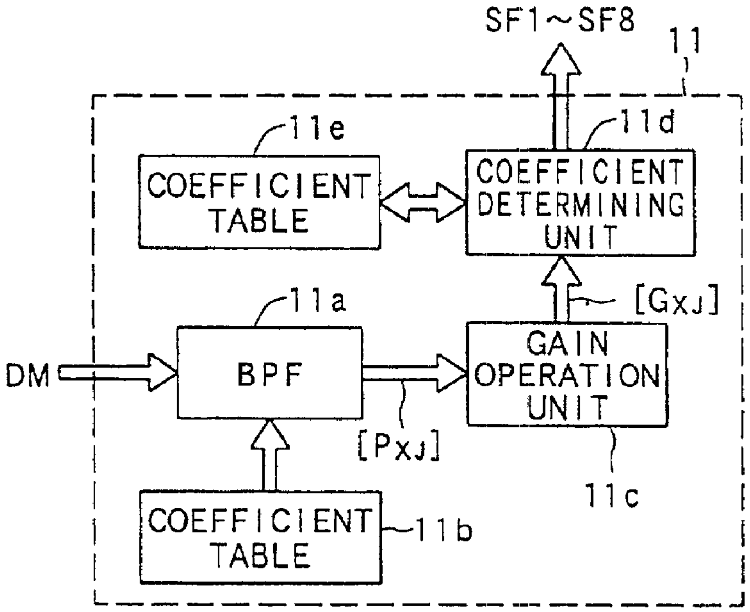
FIGS. 5A to 5C are block diagrams showing configurations of a frequency characteristics correcting unit, an inter-channel level correcting unit and a delay characteristics correcting unit shown in FIG. 4.

The frequency characteristics correcting unit 11 has a function to adjust the frequency characteristic of each channel to have a desired characteristic. As shown in FIG. 5A, the frequency characteristics correcting unit 11 includes a band-pass filter 11*a*, a coefficient table 11*b*, a gain operation unit 11*c*, a coefficient determining unit 11*d* and a coefficient table 11*e*.

The band-pass filter 11*a* is configured by a plurality of narrow-band digital filters passing 9 frequency bands set to the equalizers EQ1 to EQ8. The band-pass filter 11*a* discriminates 9 frequency bands each including center frequency f1 to f9 from the collected sound data DM from the A/D converter 10, and supplies the data [P×J] indicating the level of each frequency band to the gain operation unit 11*c*. The frequency discriminating characteristic of the band-pass filter 11*a* is determined based on the filter coefficient data stored, in advance, in the coefficient table 11*b*.

The gain operation unit 11*c* operates the gains of the equalizers EQ1 to EQ8 for the respective frequency bands at the time of the automatic sound field correction, and supplies the gain data [G×J] thus operated to the coefficient determining unit 11*d*. Namely, the gain operation unit 11*c* applies the data [P×J] to the transfer functions of the equalizers EQ1 to EQ8 known in advance to calculate the gains of the equalizers EQ1 to EQ8 for the respective frequency bands in the reverse manner.

The coefficient determining unit 11*d* generates the filter coefficient adjustment signals SF1 to SF8, used to adjust the frequency characteristics of the equalizers EQ1 to EQ8, under the control of the system controller MPU shown in FIG. 4. It is noted that the coefficient determining unit 11*d* is configured to generate the filter coefficient adjustment signals SF1 to SF8 in accordance with the conditions instructed by the listener. In a case where the listener does not instruct the sound field correction condition and the normal sound field correction condition preset in the sound field correction system is used, the coefficient determining unit 11*d* reads out the filter coefficient data, used to adjust the frequency characteristics of the equalizers EQ1 to EQ8, from the coefficient table 11*e* by using the gain data [G×J] for the respective frequency bands supplied from the gain operation unit 11*c*, and adjusts the frequency characteristics of the equalizers EQ1 to EQ8 based on the filter coefficient adjustment signals SF1 to SF8 of the filter coefficient data.

In other words, the coefficient table 11*e* stores the filter coefficient data for adjusting the frequency characteristics of the equalizers EQ1 to EQ8, in advance, in a form of a look-up table. The coefficient determining unit 11*d* reads out the filter coefficient data corresponding to the gain data [G×J], and supplies the filter coefficient data thus read out to the respective equalizers EQ1 to EQ8 as the filter coefficient adjustment signals SF1 to SF8. Thus, the frequency characteristics are controlled for the respective channels.

The inter-channel level correcting unit 12 has a role to adjust the sound pressure levels of the sound signals of the respective channels to be equal. Specifically, the inter-channel level correcting unit 12 receives the collected sound data DM obtained when the respective speakers 6FL to 6SBR are activated by the measurement signal (pink noise) DN output from the measurement signal generator 3, and measures the levels of the reproduced sounds from the respective speakers at the listening position RV based on the collected sound data DM.

Figure 5B:
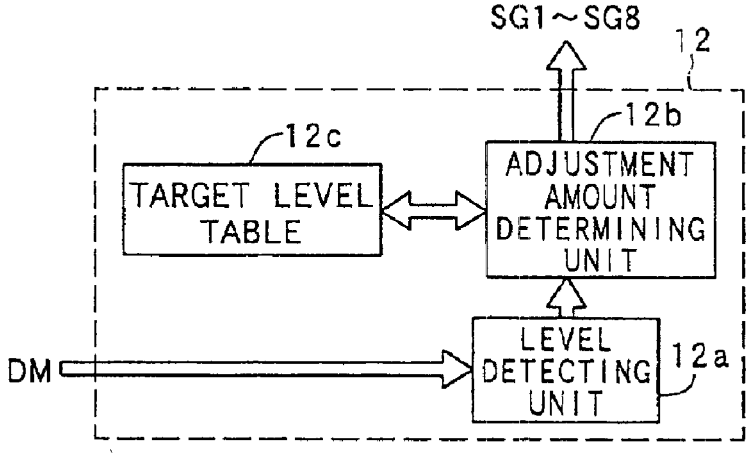

FIG. 5B shows the configuration of the inter-channel level correcting unit 12. The collected sound data DM output by the A/D converter 10 is supplied to the level detecting unit 12*a*. It is noted that the inter-channel level correcting unit 12 uniformly attenuates the signal levels of the respective channels for all frequency bands, and the frequency band division is not necessary. Therefore, the inter-channel level correcting unit 12 does not include any band-pass filter shown in the frequency characteristics correcting unit 11.

The level detecting unit 12*a* detects the level of the collected sound data DM, and carries out gain control so that the output audio signal level for all channels become equal to each other. Specifically, the level detecting unit 12*a* generates the level adjustment amount indicating the difference between the level of the collected sound data thus detected and a reference level, and supplies it to the adjustment amount determining unit 12*b*. The adjustment amount determining unit 12*b* generates the gain adjustment signals SG1 to SG8 corresponding to the level adjustment amount received from the level detecting unit 12*a*, and supplies the gain adjustment signals SG1 to SG8 to the respective inter-channel attenuators ATG1 to ATG8. The inter-channel attenuators ATG1 to ATG8 adjust the attenuation factors of the audio signals of the respective channels in accordance with the gain adjustment signals SG1 to SG8. By adjusting the attenuation factors of the inter-channel level correcting unit 12, the level adjustment (gain adjustment) for the respective channels is performed so that the output audio signal level of the respective channels become equal to each other.

The delay characteristics correcting unit 13 adjusts the signal delay resulting from the difference in distance between the positions of the respective speakers and the listening position RV. Namely, the delay characteristics correcting unit 13 has a role to prevent that the output signals from the speakers 6 to be listened simultaneously by the listener reach the listening position RV at different times. Therefore, the delay characteristics correcting unit 13 measures the delay characteristics of the respective channels based on the collected sound data DM which is obtained when the speakers 6 are individually activated by the measurement signal (pink noise) output from the measurement signal generator 3, and corrects the phase characteristics of the sound field space based on the measurement result.

Specifically, by turning over the switches SW11 to SW81 shown in FIG. 3 one after another, the measurement signal DN generated by the measurement signal generator 3 is output from the speakers 6 for each channel, and the output sound is collected by the microphone 8 to generate the corresponding collected sound data DM. Assuming that the measurement signal is a pulse signal such as an impulse, the difference between the time when the speaker 6 outputs the pulse measurement signal and the time when the microphone 8 receives the corresponding pulse signal is proportional to the distance between the speaker 6 of each channel and the listening position RV. Therefore, the difference in distance of the speakers 6 of the respective channels and the listening position RV may be absorbed by setting the delay time of all channels to the delay time of the channels having maximum delay time. Thus, the delay time between the signals generated by the speakers 6 of the respective channels become equal to each other, and the sound output from the multiple speakers 6 and coincident with each other on the time axis simultaneously reach the listening position RV.

Figure 5C:
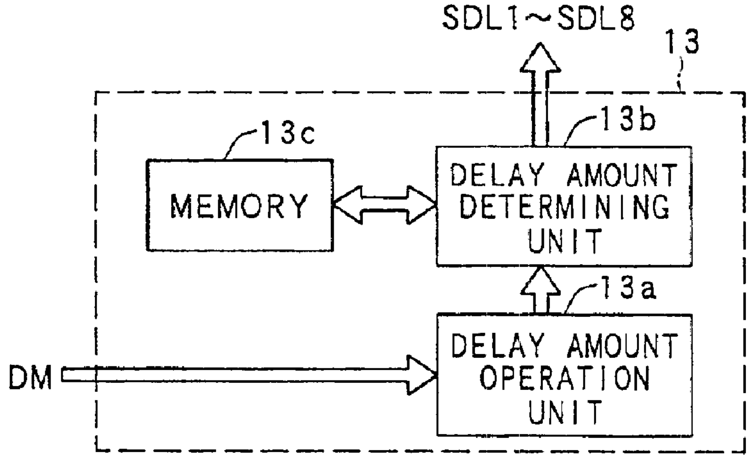

FIG. 5C shows the configuration of the delay characteristics correcting unit 13. The delay amount operation unit 13*a* receives the collected sound data DM, and operates the signal delay amount resulting from the sound field environment for the respective channels on the basis of the pulse delay amount between the pulse measurement signal and the collected sound data DM. The delay amount determining unit 13*b* receives the signal delay amounts for the respective channels from the delay amount operating unit 13*a*, and temporarily stores them in the memory 13*c*. When the signal delay amounts for all channels are operated and temporarily stored in the memory 13*c*, the delay amount determining unit 13*b* determines the adjustment amounts of the respective channels such that the reproduced signal of the channel having the largest signal delay amount reaches the listening position RV simultaneously with the reproduced sounds of other channels, and supplies the adjustment signals SDL1 to SDL8 to the delay circuits DLY1 to DLY8 of the respective channels. The delay circuits DLY1 to DLY8 adjust the delay amount in accordance with the adjustment signals SDL1 to SDL8, respectively. Thus, the delay characteristics for the respective channels are carried out. It is noted that, while the above example assumed that the measurement signal is pulse signal, this invention is not limited to this, and other measurement signal may be used.

[2] Automatic Sound Field Correcting Process

Next, the description will be given of the operation of the automatic sound field correction by the automatic sound field correcting system employing the configuration described above.

As the environment in which the audio system 100 is used, the listener positions the multiple speakers 6FL to 6SBR in the listening room 7 as shown in FIG. 6, and connects the speakers 6FL to 6SBR to the audio system 100 as shown in FIG. 1. When the listener manipulates the remote controller (not shown) of the audio system 100 to instruct the start of the automatic sound field correction, the system controller MPU executes the automatic sound field correcting process in response to the instruction.

Next, the basic principle of the automatic sound field correction according to the present invention will be described. As mentioned above, the process of the automatic sound field correction includes the frequency characteristic correction, the sound pressure level correction and the delay characteristics correction for the respective channels. The major aim of the present invention is to correct the mismatch of the phases of the respective channels resulting from the frequency characteristics correction. As mentioned above, the correction is performed for the respective channels so that the frequency characteristics of the respective channels become equal to the desired characteristics. However, as a result of such correction, the phases of the signals of the respective channels mismatch with each other.

In this view, in the present invention, the correction of the frequency characteristics is not executed individually for all channels. Namely, the correction of the frequency characteristics is executed by the unit of groups, each including multiple channels which phases are to be matched (this group will be hereinafter referred to as "identical phase group") By this, the multiple channels included in an identical phase group have no phase difference. For example, it is assumed that there is a pair of audio signals, i.e., a left-channel audio signal and a right-channel audio signal, to be supplied to a left speaker and a right speaker, respectively. When the frequency characteristics correction is executed independently for the left and the right channels, the frequency characteristic of each channel can be set to the desired characteristic individually, however, the phases between the two channels may possibly be different. This is because, the acoustic characteristics of each channel is determined by various factors such as the individual difference of the speaker characteristics and the environment in which the speakers are positioned, and the acoustic characteristics of the left and the right channels may be different from each other, due to their environments and the like, even if the same speaker is used. In such a case, if the frequency characteristics are corrected individually for the respective channels, the phases of the channels may be different. Hence, in the present invention, the frequency characteristics are simultaneously corrected for the left and right channels so that those channels are corrected by using the identical correction parameters, and thus the phase mismatch between those channels may be avoided.

However, in order to execute the frequency characteristics correction simultaneously for multiple channels, it is required, as a premise, that the levels of those channels are identical for all frequency bands. Therefore, in the present embodiment, first the level adjustment is executed for multiple channels included in the identical phase group so that the levels of the channels become identical to each other. Then, the identical measurement signal is output from multiple channels belonging to the identical phase group and collected by the microphone 8 to execute the frequency characteristics correction. Thus, the frequency characteristics correction is executed by using identical correction parameters for those multiple channels, and the phase mismatch between those channels may be avoided.

Figure 7:
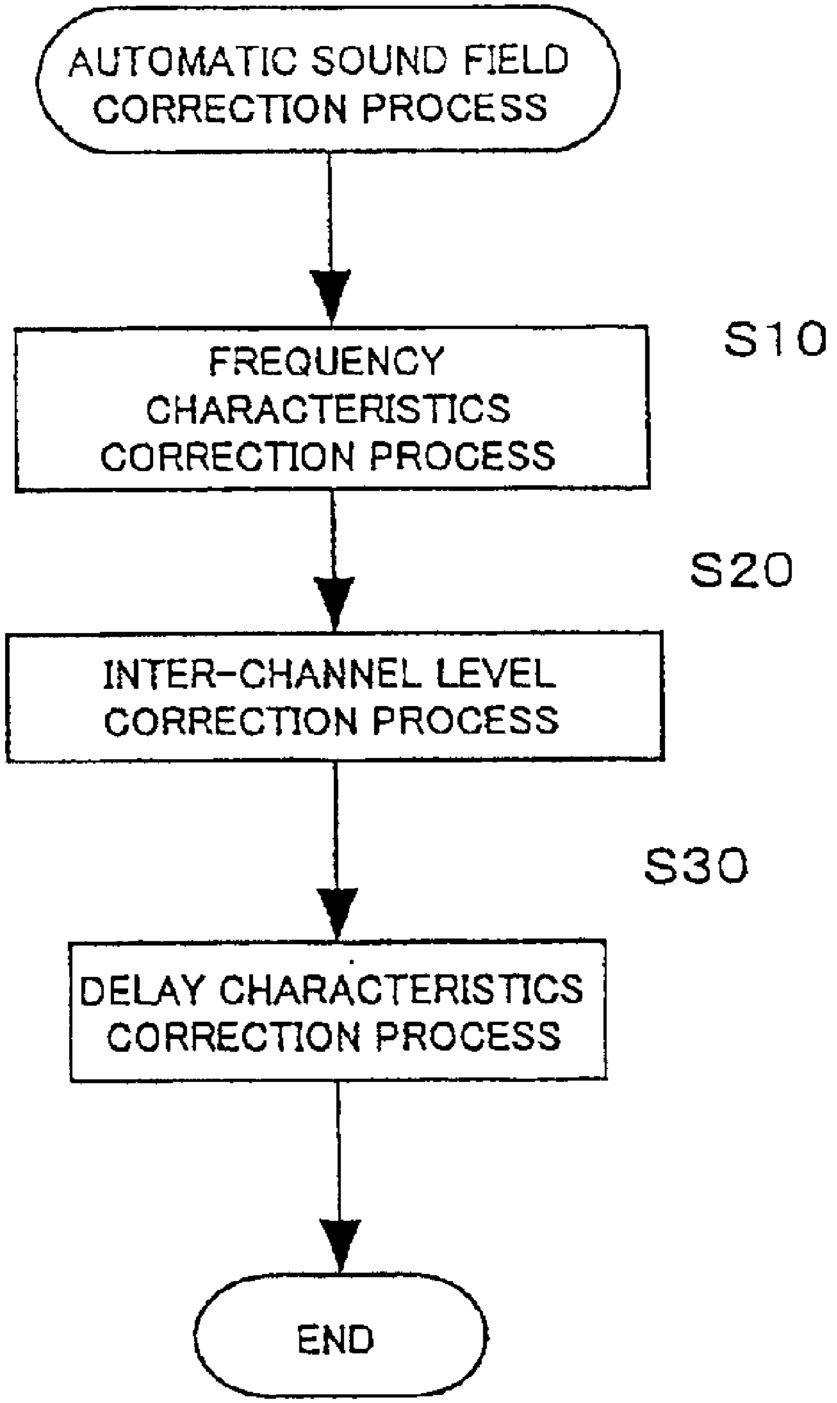
FIG. 7 is a flowchart showing a main routine of an automatic sound field correcting process.

Next, the outline of the automatic sound field correction process including the above frequency characteristics correction will be described with reference to the flowchart shown in FIG. 7.

First, by the frequency characteristics correction process in step S10, the frequency characteristics correcting unit 11 adjusts the frequency characteristics of the equalizers EQ1 to EQ8. Then, by the inter-channel level correction process in step S20, the inter-channel level correcting unit 12 adjusts the attenuation factors of the inter-channel attenuators ATG1 to ATG8 provided for the respective channels. Then, by the delay characteristics correction process in step S30, the delay characteristics correcting unit 13 adjusts the delay times of the delay circuits DLY1 to DLY8 for all channels. In this order, the automatic sound field correction according to the present invention is executed.

Next, the operation of each process will be described. First, the frequency characteristics correction process instep S10 will be described with reference to FIG. 8.

First, the level correction is executed for multiple channels belonging to the identical phase group (step S100) Assuming now that the FL-channel and FR-channel shown in FIG. 1 belong to the identical phase group. The switches SW11 and SW21 are turned ON with time delay one after another and the switches SW12 and SW22 are turned OFF at the same time, and the measurement signal DN is supplied to the FL-channel and FR-channel simultaneously to control the speakers 6FL and 6FR to output the measurement signal. The signal thus output is collected by the microphone 8 and is supplied to the signal processing circuit 2 via the amplifier 9 and the A/D converters 10. In the signal processing circuit 2, the inter-channel level correcting unit 12 shown in FIG. 4 and FIG. 5B generates the adjustment signals SG1 and SG2 for adjusting the inter-channel attenuators ATG1 and ATG2 such that the levels of the FL-channel and the FR-channel become equal to each other, and supplies the adjustment signals SG1 and SG2 to the inter-channel attenuators ATG1 and ATG2. As a result, the levels of the FL-channel and the FR-channels become equal to each other.

If this process is not performed, normally the levels of multi-channels belonging to the identical phase group are different in many cases. Therefore, the characteristic of a particular channel having high level becomes dominant at the time of the subsequent frequency characteristics correction, and the measurement cannot equally be performed for multiple channels. Namely, the level correction in step S100 has a role as a preliminary process to accurately execute the subsequent frequency characteristics correction.

When the levels of the FL-channel and the FR-channels become identical in this way, then the frequency characteristics correction is executed simultaneously for those channels. Specifically, the measurement signal DN is simultaneously output from the channels, i.e., the FL-channel and the FR-channel (step S102), and the microphone 8 collects the output sound to supply the collected sound data DM to the signal processing circuit 2 (step S104). The frequency characteristics correcting unit 11 (see. FIG. 4 and FIG. 5B) operates the equalizer coefficients SF1 and SF2 for adjusting the characteristics of the equalizers EQ1 and EQ2 based on the collected sound data DM (step S106), and supplies them to the equalizers EQ1 and EQ2 to correct the frequency characteristics of the FL-channel and the FR-channel (step S108). By this, the frequency characteristics of the FL-channel and the FR-channel are set to the desired characteristics. In addition, since the frequency characteristics of the FL-channel and the FR-channel are corrected by the same parameter (equalizer coefficient), the phases of those channels match with each other. Therefore, the phases of multiple channels can be matched with each other, and those channels may substantially be set to desired frequency characteristics.

While the FL-channel and the FR-channel constitute the identical phase group in the above example, the number and the combination of the channels constituting the identical phase group may be variously set. In theory, by correcting the frequency characteristics individually for all channels, without setting the identical phase group, the frequency characteristic of each channel may be adjusted to be equal to the desired frequency characteristic. However, since the phases of the channels become mismatched, the listener may have strange feeling in auditory sense. On the other hand, if all channels are set to constitute an identical phase group, the phases of the channels become identical, but it becomes difficult to individually set the frequency characteristics of those channels to desired characteristics. Therefore, it is preferred that the identical phase group is determined such that the frequency characteristics of the channels can be independently controlled to have desired characteristics as long as the listener does not feel strange auditory feeling. Actually, the combination of the channels that constitutes the identical phase group is appropriately determined in consideration of various factors relating to the sound field, for example, the environment where the audio system 100 is placed, the number and the characteristics of the speakers and the listener's taste. As the method of determining the identical phase group, the system maybe configured such that the listener who sets multiple speakers can determine the identical phase group according to his or her taste. Alternatively, the system may be configured such that the listener inputs information such as the number, the type (all-range, high-range, low-range, etc.) and the power of the speakers installed, and the system automatically determines the identical phase group based on the information thus input according to some presetting.

Generally, if the phases of the left and right speakers do not match, the listener feels much strange auditory feeling. Therefore, as one concrete method, a left speaker and a right speaker are set to the identical phase group and the frequency characteristic correction is executed for the unit of the identical phase group. In the example of FIG. 1, if the FL-channel and the FR-channel, the RL-channel and the RR-channel, the SBL-channels and the SBR-channel are set to constitute the identical phase groups, respectively, the phases for each pair of channels match with each other, and the listener feels less strange auditory feeling.

Also, in a case where a pair of left and right speakers exist, if a center speaker also exists at the center of the left and the right speakers, it is possible that the left and the right speakers are not set as the identical phase group. When only a pair of left and right speaker exists, the sound image locates off the center of those speakers due to the phase mismatch, and hence the listener has much strange auditory feeling. However, if the center speaker exists at the center of the left and the right speakers, the output from the center speaker becomes dominant in the listener's auditory sense, and the listener does not feel small shift or deviation of the sound image due to the phase mismatch of the left and right speakers. Therefore, if the center speaker exists, the correction of the frequency characteristics may be prioritized, and the frequency characteristics of a pair of the left and right speakers and the center speaker may be independently controlled.

When the frequency characteristics correction for one identical phase group is completed, it is determines whether or not other identical phase group exists (step S110). If it exists, the same frequency characteristics correction is executed for the next identical phase group (steps S100 to S108) Then, if the frequency characteristics correction is completed for all identical phase groups (step S110; Yes), then the frequency characteristics correction for the remaining channels, i.e., the channel which does not belong to the identical phase group (step S112). Thus, the frequency characteristics correction for all channels is completed, and the process goes back to the main routine shown in FIG. 7.

Figure 8:
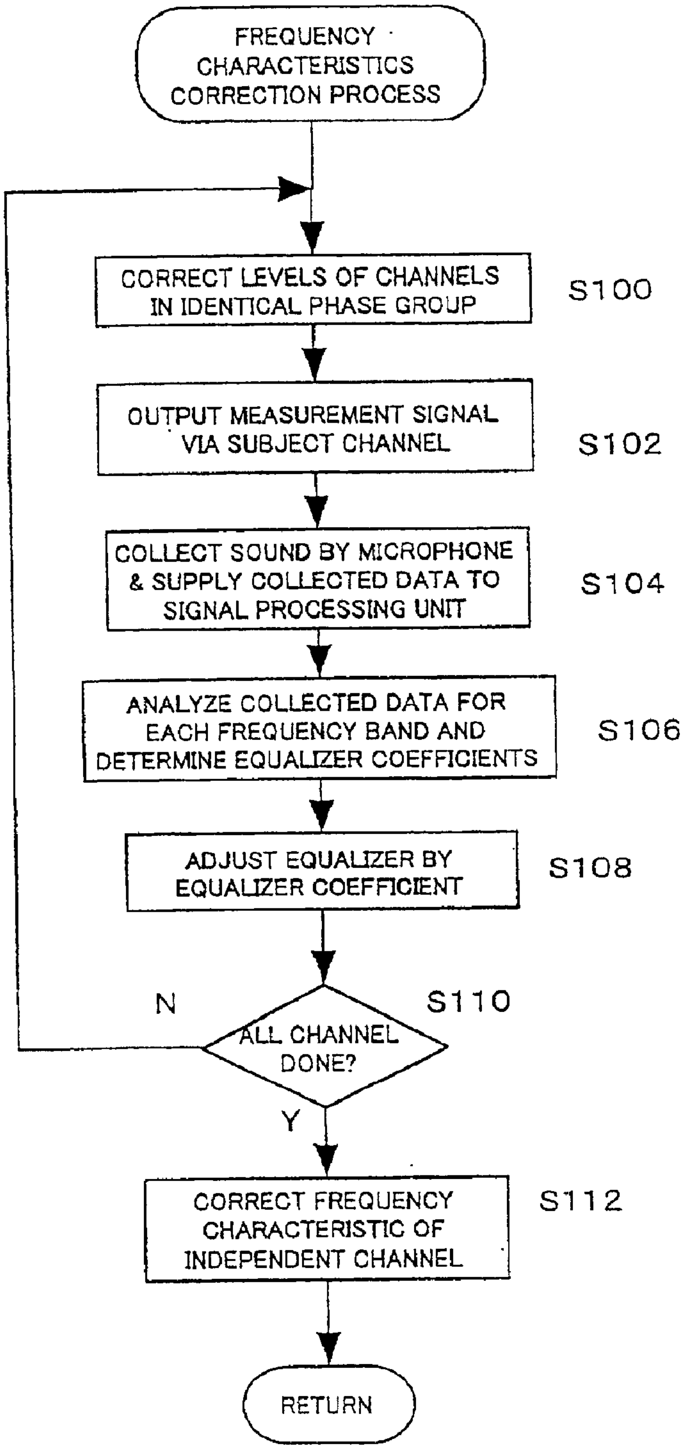
FIG. 8 is a flowchart showing a frequency characteristics correcting process.

It is noted that the gain of the equalizer obtained based on the output of the band-pass filter within the coefficient operation unit 11 may include error, and hence steps S100 to S112 shown in FIG. 8 may be repeatedly executed for several times (e.g., four times) to absorb such error. In the above example, the advance level adjustment (step S100) is executed for all channels. Alternatively, the level adjustment may be executed for all channels if at least one identical phase group exists.

Figure 9:
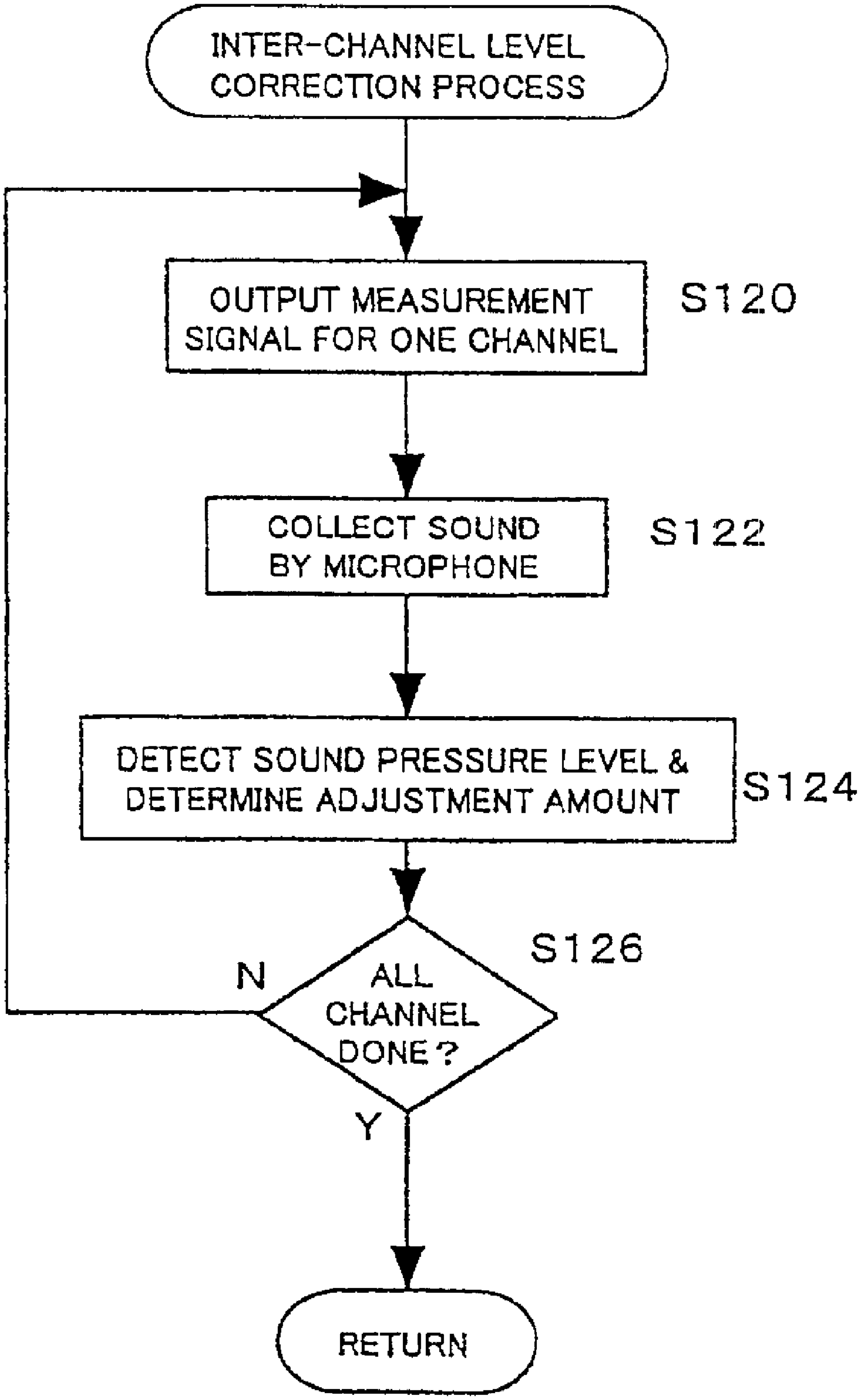
FIG. 9 is a flowchart showing an inter-channel level correcting process.

Next, the inter-channel level correction process of step S20 is executed. The inter-channel level correction process is executed according to the flowchart shown in FIG. 9. It is noted that the inter-channel level correction process is executed in such a state that the frequency characteristics of the graphic equalizer GEQ set by the frequency characteristics correction process is maintained.

In the signal processing unit 20 shown in FIG. 3, first the switch SW11 is turned ON and the switch SW1 is turned OFF at the same time. Thus, the measurement signal DN (pink noise) is supplied to one channel (e.g., FL-channel), and the measurement signal DN is output by the speaker 6FL (step S120) The microphone 8 collects the output signal (sound), and the collected sound data DM is supplied to the inter-channel level correcting unit 12 in the coefficient operation unit 30 through the amplifier 9 and the A/D converter 10 (step S122). In the inter-channel level correcting unit 12, the level detecting unit 12*a* detects the sound pressure level of the collected sound data DM, and supplies the detected level to the adjustment amount determining unit 12*b*. The adjustment amount determining unit 12*b* generates the adjustment signal SG1 of the inter-channel attenuator ATG1 so that the detected level becomes equal to the predetermined sound pressure level preset in the target level table 12*c*, and supplies the generated adjustment signal SG1 to the inter-channel attenuator ATG1 (step S124). Thus, the level of one channel is corrected to match the preset level. This process is executed individually for each channel, and when the level correction is completed for all channels (step S126; Yes), the process returns to the main routine shown in FIG. 7.

Figure 10:
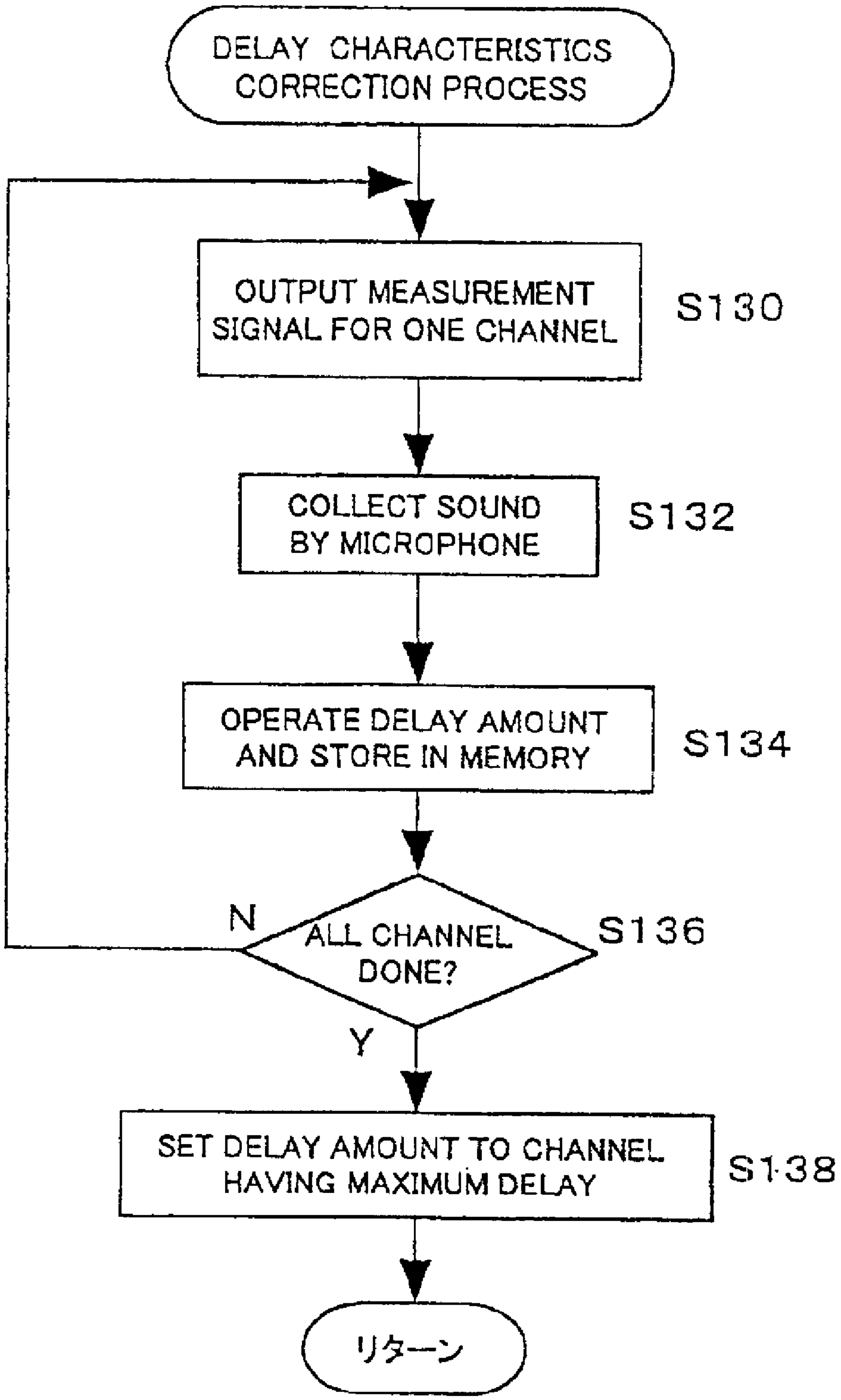
FIG. 10 is a flow chart showing a delay correcting process.

Next, the delay characteristics correction process in step S30 is executed according to the flowchart shown in FIG. 10. First, for one channel (e.g., FL-channel), the switch SW11 is turned ON and the switch SW21 is turned OFF at the same time to output the measurement signal DN from the speaker 6 (step S130). Then, the microphone 8 collects the output measurement signal DN, and the collected sound data DM is supplied from the microphone 8 to the delay characteristics correcting unit 13 in the coefficient operation unit 30 (step S132). In the delay characteristics correcting unit 13, the delay amount operation unit 13*a* calculates the delay amount for the channel and temporarily stores the delay amount in the memory 13*c* (step S134). This process is executed for all other channels. When the process is completed for all channels (step S136; Yes), the delay amounts for all channels are stored in the memory 13*c*. Then, based on the delay amounts stored in the memory 13*c*, the coefficient operation unit 13*b* determines the coefficients of the delay circuits DLY1 to DLY8 for all channels such that the signals of all channel reach the listening position RV at the same time, and supplies the coefficients thus determined to the delay circuits DLY1 to DLY8, respectively (step S138). Thus, the delay characteristics correction is completed.

In the above manner, the frequency characteristics, the inter-channel levels and the delay characteristics are corrected, and automatic sound field correction is completed. As described above, by executing the frequency characteristics correction simultaneously for multiple channels which phases are to be matched and by executing frequency characteristics correction for those multiple channels by using the same correction parameters (equalizer coefficients), the phase mismatch may be avoided for those multiple channels, and the strange auditory feeling that the listener may have can be reduced.

Next, the measurement signal will be studied. Various signals other than pink noise may be used as the measurement signal in the present invention. In the case where the measurement signal is output from multiple channels at the same time like the case where the frequency characteristics correction is executed for the unit of the identical phase group described above, it is preferred that the measurement signals output from the respective channels do not have correlation with each other. This is because, if the measurement signals output at the same time have correlation, that correlation affects the frequency characteristics, the level characteristics, the delay characteristics and the like detected at the time of the sound field correction, and hence sound field characteristics in a pure sense cannot be obtained.

Figure 13:
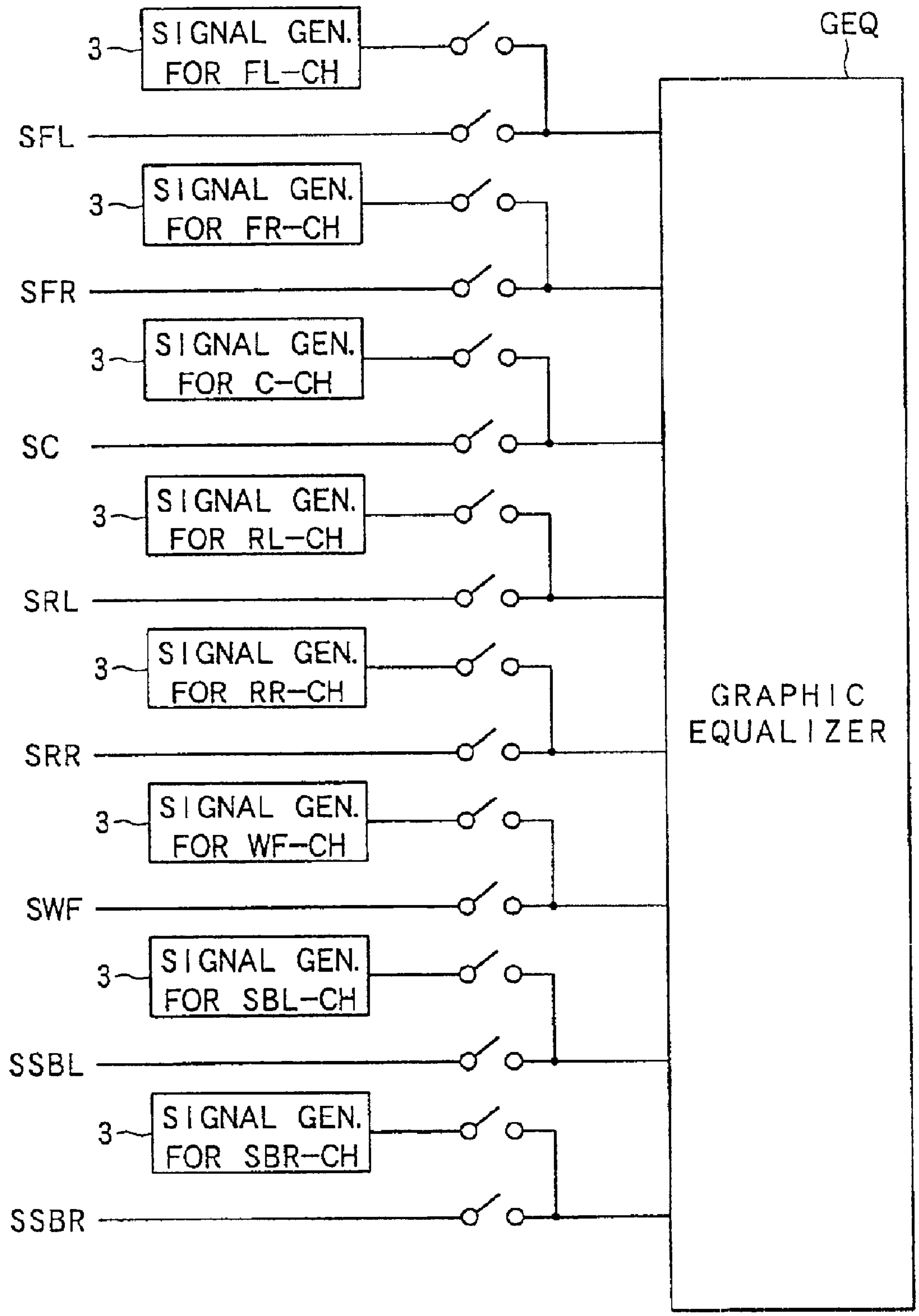
FIG. 13 is an example of a configuration for generating measurement signals having no correlation for each channel.

FIG. 13 shows an example of configuration that generates the measurement signals having no correlation between channels. In the example shown in FIG. 13, the measurement signal generators are provided independently for multiple channels, and each measurement signal generator generates measurement signal having no correlation with the measurement signal of other channels. Alternatively, pseudo non-correlated measurement signals may be produced by largely differentiating the delay times of the delay circuits DLY1 to DLY8 shown in FIG. 3 (e.g., by setting the delay times to be larger than the delay time of the sound within the listening room).

[3] Modified Embodiment

Next, the modified embodiment of the present invention will be described. In the embodiment described above, the frequency characteristics are corrected simultaneously for multiple channels belonging to the identical phase group, thereby to avoid the adverse effect resulting from the phase mismatch. However, as mentioned above, there is a trade-off relation between the prioritization of the phase match and the prioritization of adjusting the frequency characteristics of the respective channels to desired characteristics, and it is necessary to determine which one should be put higher priority in consideration of the environment in which this audio system is placed and other factors. Therefore, it is advantageous if the listener can determine which one is more important.

In this view, in the following modified embodiment, the gain adjustment amounts SF of the equalizers EQ of the respective channels obtained by the method in which the frequency characteristics are corrected for the unit of the identical phase group are stored in a memory, and further the gain adjustment amount SF of the equalizers EQ obtained by the method in which the frequency characteristics are corrected independently for the respective channels are also stored in the memory. Then, the listener selects either one according to the taste to create desired sound field.

Figure 11:
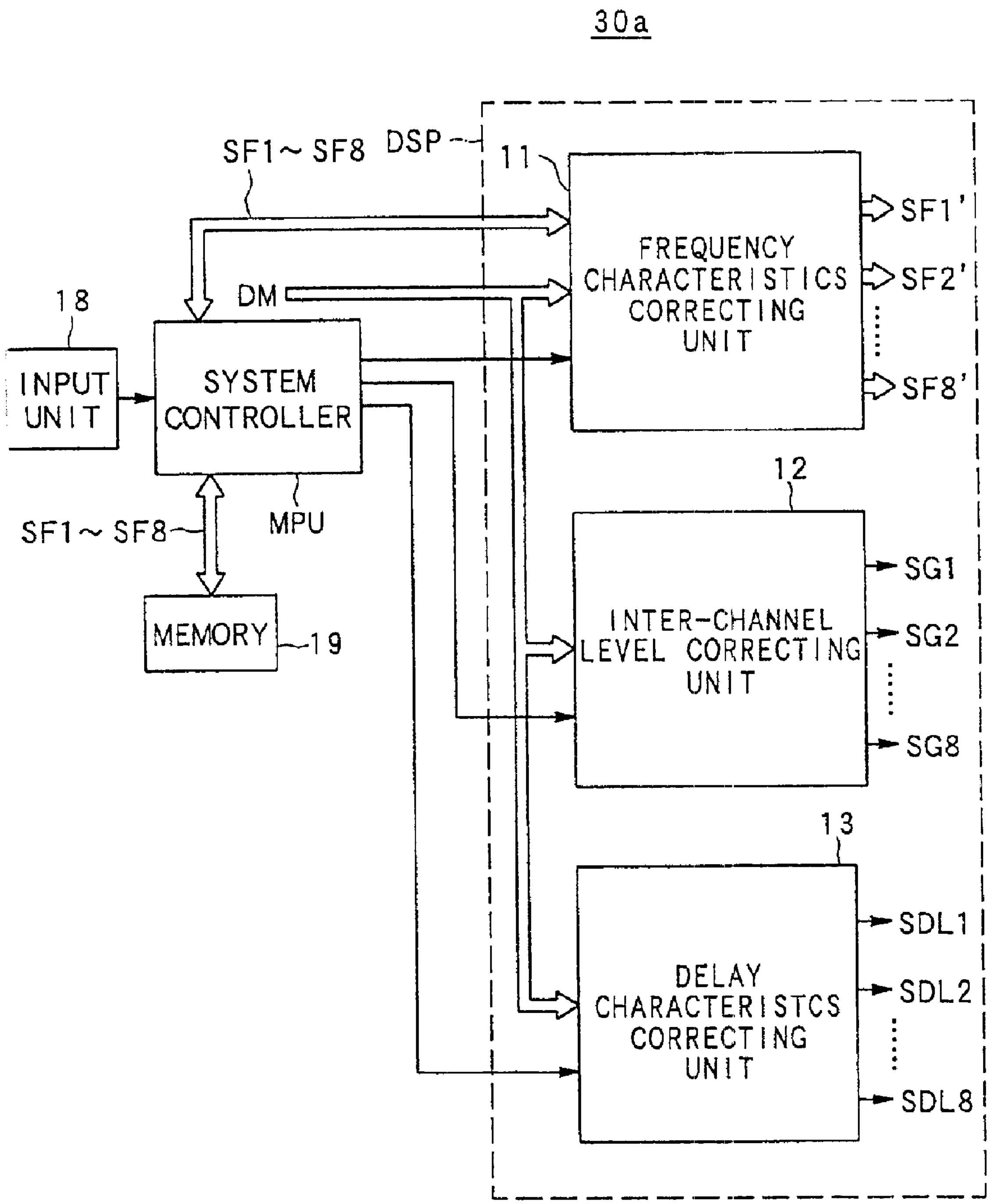
FIG. 11 is a block diagram showing a configuration of a coefficient operation unit according to a modified embodiment of the invention.

The configuration of the coefficient operation unit 30*a* to achieve this modification is shown in FIG. 11. FIG. 11 shows the modified configuration of the coefficient operation unit 30 shown in FIG. 4. The coefficient operation unit 30*a* differs from the coefficient operation unit 30 in that the adjustment signals SF1 to SF8 are transferred in two-way between the system controller MPU and the frequency characteristics correcting unit 11 and that the input unit 18 and the memory 19 are connected to the system controller MPU.

Figure 12:
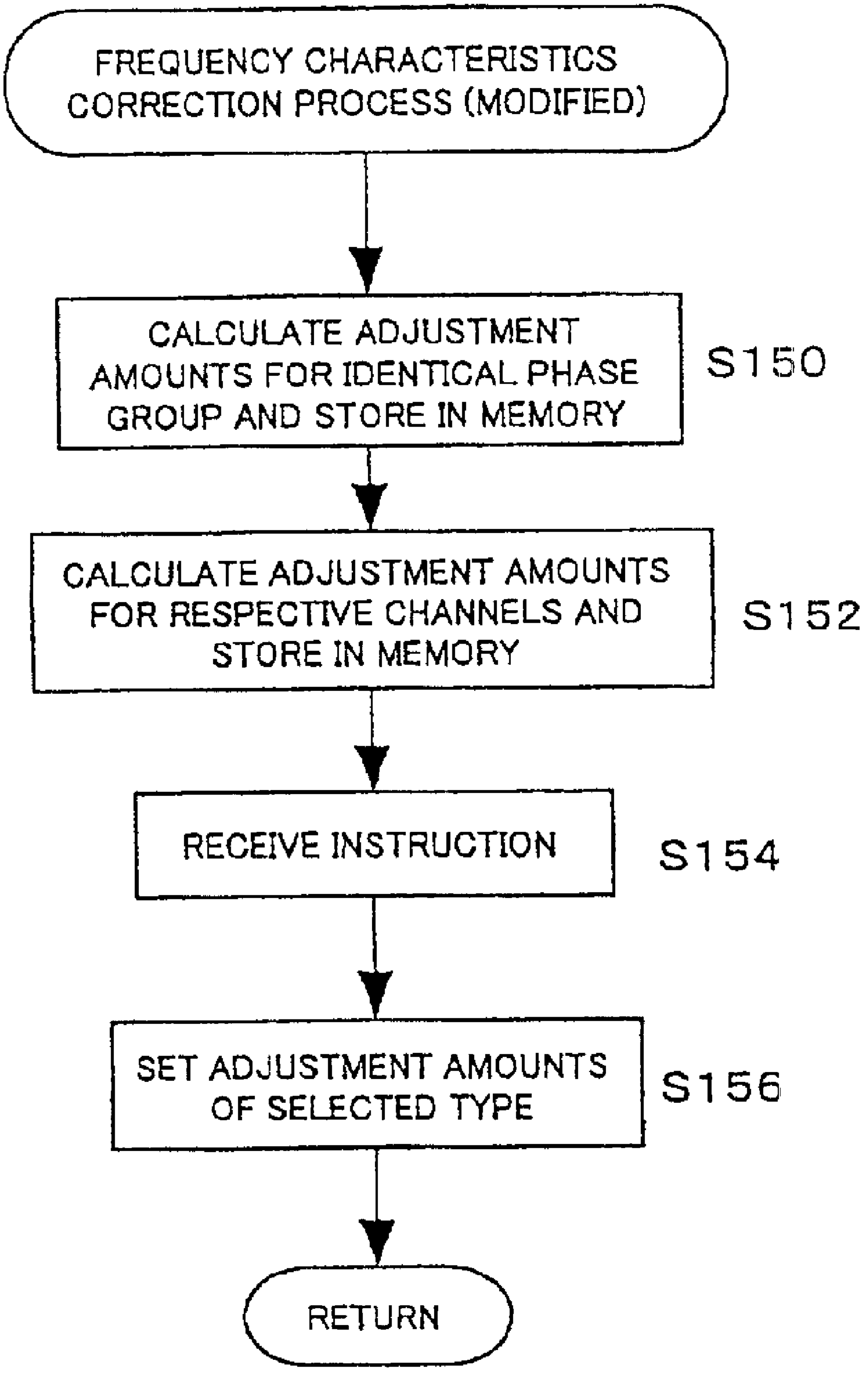
FIG. 12 is a flowchart showing a frequency characteristics correcting process according to the modified embodiment of the invention.

Next, the frequency characteristics correction process according to this modified embodiment will be described with reference to the flowchart shown in FIG. 12. In the coefficient operation unit 30*a*, first the gain adjustment amounts SF1 to SF8 are obtained by the method in which the frequency characteristics are corrected by the unit of the identical phase group, and the gain adjustment amounts SF thus obtained are stored in the memory 19 (step S150). Subsequently, the gain adjustment amounts SF1 to SF8 are obtained by the method in which the frequency characteristics are independently corrected for the respective channels, and the gain adjustment amounts SF thus obtained are stored in the memory 19 (step S152). Then, the coefficient operation unit 30*a* receives the instruction as to which type of frequency characteristics correction the listener desires from the input unit 18. The system controller MPU reads out the gain adjustment amounts of the type that the listener selected, and then supplies the gain adjustment amounts to the respective equalizers EQ1 to EQ8 as the gain adjustment amounts SF1 to SF8 to correct the frequency characteristics. Thus, the frequency characteristics are corrected according to the method that the listener selected.

In the above modified embodiment, the listener selects desired one of two methods. Alternatively, the system may be designed to automatically select one of the methods in consideration of the characteristics of the sound source and the like. For example, the system may select the method in which the frequency characteristics is corrected by the unit of the identical phase group so as to eliminate the adverse effect of the phase mismatch in the case of sound source having relatively large number of phantom sound images, and may select the method in which the frequency characteristics are independently corrected for the respective channels in the case of sound source having relatively small number of phantom sound images.

Further, as a still another embodiment, the gain adjustment amounts SF1 to SF8 are obtained by correcting the frequency characteristics independently for the respective channels, and then the common gain adjustment amount may be determined by averaging the gain adjustment amounts thus obtained. For example, assuming that the FL-channel and the FR-channel constitute one identical phase group in the example of FIGS. 1 and 2, the measurement signal is output in an order from the FL-channel to other channels to execute the frequency characteristics correction, and the gain adjustment amounts obtained are stored in the signal processing unit 20 for each channel. Then, the average of the gain adjustment amounts for the FL-channel and the FR-channel is calculated, and the averaged adjustment amount is applied to the equalizers EQ1 and EQ2 of the FL-channel and the FR-channel to execute the frequency characteristics correction of those channels. By this method, the same correction parameter is applied to the multiple channels belonging to the identical phase group, the phases of those channels match and the strange auditory feeling of the listener may be reduced.

Figure 14:
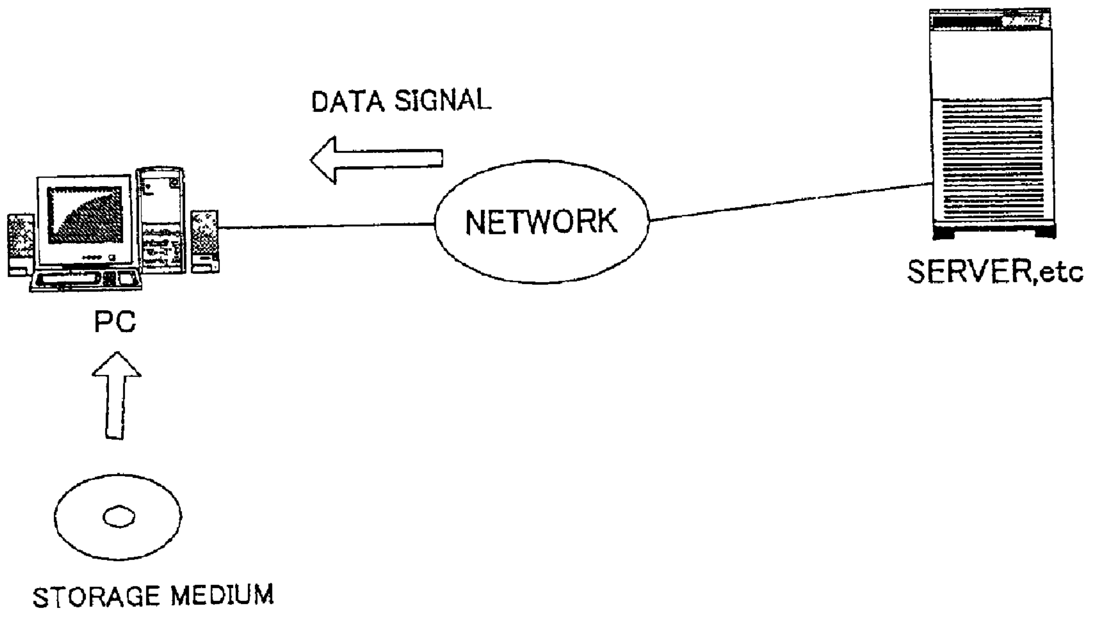
FIG. 14 shows a concept of application of the present invention to computer program.

In the above described embodiments, the signal processing is achieved by the signal processing circuit. Alternatively, the signal processing is designed as a program to be executed on a computer. The concept of this application is shown in FIG. 14. In that case, the program may be supplied in a form of storage medium such as CD-ROM or DVD, or supplied via the communication path through the network. The computer for executing this program may be a personal computer, to which an audio interface for multiple channels, multiple speakers and a microphone are connected as peripheral equipments. In the case of executing the above program in the personal computer, the measurement signal is generated by a sound source provided inside or outside of the computer, the measurement signal is output via the audio interface or speaker and the output sound is collected by the microphone. Thus, the automatic sound field correcting system shown in FIG. 1 maybe achieved by a computer.

As described above, according to the automatic sound field correcting system of the present invention, the frequency characteristics correction process is executed simultaneously for groups including multiple channels to obtain identical correction parameters for those channels. Therefore, the phase mismatch between the channels may be avoided. By this, the sound field space created by the audio system may be ideal and sound field creation with presence can be achieved.

In addition, by setting multiple channels constituting the identical phase group to a pair of left and right channels, for example, the problem of the reduction of the frequency characteristic correcting capability due to the phase characteristics improvement may be solved to a certain degree without substantial problem, with maintaining the phase match. Further, if the front and rear speakers are not set as an identical phase group, the desired frequency characteristics can be achieved for each front, rear and center speakers with maintaining the phase match between the pair of left and right speakers.

Still further, by selectively switching the method in which the frequency characteristics are corrected simultaneously for multiple channels and the method in which the frequency characteristics are corrected independently for the respective channels in consideration of the sound source, for example, appropriate sound field correction may be achieved in various situations.

The invention may be embodied on other specific forms without departing from the spirit or essential characteristics thereof. The present embodiments therefore to be considered in all respects as illustrative and not restrictive, the scope of the invention being indicated by the appended claims rather than by the foregoing description and all changes which come within the meaning an range of equivalency of the claims are therefore intended to embraced therein.

The entire disclosure of Japanese Patent Application No. 2001-133571 filed on Apr. 27, 2001 including the specification, claims, drawings and summary is incorporated herein by reference in its entirety.

What is claimed is:

1. An automatic sound field correcting device for applying signal processing onto a plurality of audio signals on corresponding signal transmission paths and outputting processed audio signals to a plurality of speakers, comprising:

equalizers for adjusting frequency characteristics of the audio signals on the signal transmission paths;

a measurement signal supplying unit for supplying a measurement signal to the respective signal transmission paths;

a sound collecting unit for collecting sound of the measurement signals output by the speakers and outputting a detection signal of the collected sound; and a gain value determining unit for determining equalizer gain values which the equalizers use for adjustment of the frequency characteristics based on the detection signal and for supplying the equalizer gain values to the equalizers, wherein the gain value determining unit determines identical equalizer gain value for a plurality of signal transmission paths for which phases of the audio signals are to be matched.

2. A device according to claim 1, wherein the gain value determining unit determines the identical equalizer gain value based on the detection signals for the sound of the measurement signal simultaneously output by the speakers of the plurality of signal transmission paths for which the phases of the audio signal are to be matched.

3. A device according to claim 1, further comprising an inter-path level adjusting unit for adjusting levels of the audio signals of the signal transmission paths, wherein the inter-path level adjusting unit corrects the levels of the signal transmission paths, prior to the adjustment of the frequency characteristics by the equalizers, such that the levels of the audio signals of the signal transmission paths become equal for all frequency bands.

4. A device according to claim 3, further comprising a level change unit for changing levels of the audio signals of the signal transmission paths, wherein the inter-path level adjusting unit controls the level change unit to correct the levels of the signal transmission paths based on the detection signals of the sound of the measurement signals simultaneously output by the plurality of speakers of the signal transmission paths for which the phases of the audio signal are to be matched.

5. A device according to claim 3, wherein the inter-path level adjusting unit adjusts the levels of the signal transmission paths such that the levels of the signal transmission paths are equal to each other after the adjustment of the frequency characteristics of the signal transmission paths.

6. A device according to claim 1, wherein the plurality of signal transmission paths for which the phases of the audio signal are to be matched comprises a pair of signal transmission paths corresponding to a pair of left and right speakers.

7. A device according to claim 6, wherein the pair of left and right speakers comprises at least one of front speakers, rear speakers and surround speakers.

8. A device according to claim 6, wherein the pair of left and right speakers comprises speakers for which no center speaker is positioned between the left speaker and the right speaker.

9. A device according to claim 1, wherein the gain value determining unit determines the identical equalizer gain value by averaging the equalizer gain values determined individually for each of the signal transmission paths for which the phases of the audio signals are to be matched.

10. A device according to claim 1, wherein the gain value determining unit comprises:

a storage unit for storing the equalizer gain values determined independently for the signal transmission paths and the identical equalizer gain values determined for the plurality of signal transmission paths for which the phases of the audio signals are to be matched; and a selecting unit for selecting one of the equalizer gain values determined independently and the identical equalizer values.

11. A device according to claim 1, wherein the measurement signal supplying unit generates the measurement signals which correspond to the signal transmission paths and which have no correlation with each other.

12. A device according to claim 11, further comprising a plurality of delay circuits each provided in the signal transmission path for adjusting delay characteristics of the audio signals, wherein the measurement signal supplying unit generates the measurement signals having no correlation by setting different delay times for the plurality of delay circuits.

13. A program storage device readable by a computer, tangibly embodying a program of instructions executable by the computer to control the computer to function as an automatic sound field correcting device for applying signal processing onto a plurality of audio signals on corresponding signal transmission paths and outputting the processed audio signals to a plurality of speakers, the automatic sound field correcting device comprising:

equalizers for adjusting frequency characteristics of the audio signals on the signal transmission paths;

a measurement signal supplying unit for supplying a measurement signal to the respective signal transmission paths;

a sound collecting unit for collecting sound of the measurement signal output by the speakers and outputting a detection signal of the collected sound; and a gain value determining unit for determining equalizer gain values which the equalizer uses for adjustment of the frequency characteristics and for supplying the equalizer gain values to the equalizers, wherein the gain value determining unit determines identical equalizer gain value for a plurality of signal transmission paths for which phases of the audio signals are to be matched.

14. A computer data signal embodied in a carrier wave and representing a series of instructions which cause a computer to function as an automatic sound field correcting device for applying signal processing onto a plurality of audio signals on corresponding signal transmission paths and outputting the processed audio signals to a plurality of speakers, the automatic sound field correcting device comprising:

equalizers for adjusting frequency characteristics of the audio signals on the signal transmission paths;

a measurement signal supplying unit for supplying a measurement signal to the respective signal transmission paths;

a sound collecting unit for collecting sound of the measurement signal output by the speakers and outputting a detection signal of the collected sound; and a gain value determining unit for determining equalizer gain values which the equalizer uses for adjustment of the frequency characteristics and for supplying the equalizer gain values to the equalizers, wherein the gain value determining unit determines identical equalizer gain value for a plurality of signal transmission paths for which phases of the audio signals are to be matched.

* * * * *